(12) United States Patent
Liao et al.

(10) Patent No.: US 9,760,022 B2
(45) Date of Patent: Sep. 12, 2017

(54) LITHOGRAPHY MACHINE WORKPIECE TABLE AND VERTICAL POSITION INITIALIZATION METHOD THEREOF

(71) Applicant: SHANGHAI MICRO ELECTRONICS EQUIPMENT CO., LTD., Shanghai (CN)

(72) Inventors: Feihong Liao, Shanghai (CN); Yuebin Zhu, Shanghai (CN); Haili Jia, Shanghai (CN); Shuping Hu, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days.

(21) Appl. No.: 15/122,019

(22) PCT Filed: Feb. 12, 2015

(86) PCT No.: PCT/CN2015/072835
§ 371 (c)(1),
(2) Date: Aug. 26, 2016

(87) PCT Pub. No.: WO2015/127863
PCT Pub. Date: Sep. 3, 2015

(65) Prior Publication Data
US 2017/0017168 A1    Jan. 19, 2017

(30) Foreign Application Priority Data
Feb. 28, 2014  (CN) .......................... 2014 1 0070238

(51) Int. Cl.
*G03B 27/58* (2006.01)
*G03F 7/20* (2006.01)

(52) U.S. Cl.
CPC ...... *G03F 7/70725* (2013.01); *G03F 7/70758* (2013.01); *G03F 7/70775* (2013.01)

(58) Field of Classification Search
CPC ............. G03F 7/70725; G03F 7/70758; G03F 7/70716
(Continued)

(56) References Cited

U.S. PATENT DOCUMENTS 6,008,610 A * 12/1999 Yuan .................... G03F 7/70725
                                                         318/592
6,445,440 B1 * 9/2002 Bisschops ........... G03F 7/70716
                                                         355/53

FOREIGN PATENT DOCUMENTS

CN      1442755 A       9/2003
CN      201436604 U     4/2010
(Continued)

OTHER PUBLICATIONS

Written Opinion of the International Search Authority with English Translation issued in PCT/CN2015/072835 dated Apr. 29, 2016 (8 pages).

*Primary Examiner* — Hung Henry Nguyen
(74) *Attorney, Agent, or Firm* — Muncy, Geissler, Olds & Lowe, P.C.

(57) ABSTRACT

A fine-motion module for use in a wafer stage of a photolithography tool includes: a base (201); a fine-motion plate (210); a plurality of vertical motors (203), fixed between the base and the fine-motion plate; a plurality of gravity compensators (202), each having one end fixed on the base and the other end configured to support the fine-motion plate; a plurality of absolute-position sensors (205, 211), configured to measure an absolute position of the fine-motion plate and to adjust pressures in the gravity compensators based on the obtained absolute-position measurements such that the absolute position of the fine-motion plate is changed to a pre-
(Continued)

determined initial vertical position; and a plurality of relative-position sensors (204, 207), configured to measure a relative position of the fine-motion plate to the base and to control the fine-motion plate based on the obtained relative-position measurements, thereby moving the fine-motion plate to a relative zero position.

13 Claims, 6 Drawing Sheets

(58) Field of Classification Search
USPC .................................................. 355/72–76
See application file for complete search history.

(56) References Cited

FOREIGN PATENT DOCUMENTS

| | | |
|---|---|---|
| CN | 102537049 A | 7/2012 |
| CN | 102566287 A | 7/2012 |
| EP | 2 075 484 A1 | 7/2009 |

\* cited by examiner

LITHOGRAPHY MACHINE WORKPIECE TABLE AND VERTICAL POSITION INITIALIZATION METHOD THEREOF

TECHNICAL FIELD

The present invention relates to the fabrication of semiconductor devices and, more particularly, to a wafer stage in a photolithography tool and methods for initialization of a vertical position thereof.

BACKGROUND

Photolithography tools are used to transfer a pattern on a mask onto a wafer or a glass substrate. During this course, the wafer or the glass substrate is carried by a wafer stage to move horizontally in synchronization with a mask stage, with its vertical position being focused and leveled in accordance with settings of a focusing and leveling system (FLS). Errors in movement of the wafer stage can pose a direct impact on imaging quality of a projection objective. In order to reduce vertical focusing and leveling errors, the vertical position of the wafer stage is maintained by a vertical motion module which is supported by low-rigidity gravity compensators for blocking the transmission of low-frequency vibrations from a base frame to the vertical motion module. A typical design of such a low-rigidity gravity compensator is as disclosed in the patent document CN201010571517.8. Patent document CN201010618373.7 describes a typical wafer stage.

As disclosed in the patent document CN201010618373.7, precise vertical positioning of the wafer stage is realized by controlling it based on grating scales, i.e., on relative-position feedbacks. Wherein, the establishment of a vertical zero (initial) position of the wafer stage is effectuated by a zeroing process during the initialization. In addition, prior to the zeroing process, an initial vertical position of the wafer stage, i.e., its physical position, also known as an absolute position, is ensured by the gravity compensators. However, as the gravity compensators are controlled using a pressure control loop without any feedback loop for the absolute position, the initial position is significantly susceptible to pressure fluctuations in the gas supply and disturbance introduced by a load, and the lower the rigidity of the gravity compensators, the greater deviations in the initial vertical relative position will result from the gas-supply pressure fluctuations and load-caused disturbance.

Possible consequences of a considerable drift in the initial vertical position include: 1) failure of the wafer stage's initialization upon pneumatic vibration of a cylindrical gas bearing in the wafer stage; 2) considerable vertical zeroing errors during the initialization, which may lead to significant zero position deviations of the wafer stage relative to the whole system; and 3) an inferior vertical motion precision after the initialization.

Test data showed that a vertical deviation of the above-described wafer stage was up to 0.3 mm, exceeding the maximum permitted value that was 0.1 mm. Although this can be mitigated by increasing the accuracy of control valves, it is impossible to eliminate its root causes in this way. Currently, the primary cause of insufficient reliability of a wafer stage lies in deviations in its initial vertical position which are attributable to the absence of absolute zero-position references.

SUMMARY OF THE INVENTION

In order to overcome the shortcomings of the prior art, the present invention adds vertical zero-position references to an existing wafer stage and described methods for vertical position initialization thereof.

The present invention proposes a fine-motion module for use in a wafer stage of a photolithography tool, including a base; a fine-motion plate; a plurality of vertical motors, fixed between the base and the fine-motion plate; a plurality of gravity compensators, each having one end fixed on the base and the other end configured to support the fine-motion plate; a plurality of absolute-position sensors, configured to measure an absolute position of the fine-motion plate and to adjust pressures in the plurality of gravity compensators based on the obtained absolute-position measurements such that the absolute position of the fine-motion plate is changed to a predetermined initial vertical position; and a plurality of relative-position sensors, configured to measure a relative position of the fine-motion plate to the base and to control the fine-motion plate based on the obtained relative-position measurements so that the fine-motion plate is moved to a relative zero position.

Preferably, the plurality of absolute-position sensors may be eddy current sensors, linear variable differential transformer sensors, or linear differential sensors.

Preferably, the plurality of relative-position sensors may be laser interferometers, laser scales or grating scales.

Preferably, the pressures in the plurality of gravity compensators may be controlled using proportional pressure valves.

Preferably, the fine-motion module may further include a plurality of elongated mirrors and a circular gas levitator.

The present invention also proposes a photolithography tool incorporating the fine-motion module as defined above and further including a horizontal module, a pre-alignment module and a substrate transfer module.

The present invention also proposes a method for initialization of a vertical position of a fine-motion module, including the steps of:

step 1) determining whether a difference of the absolute position of the fine-motion plate from the predetermined initial vertical position is smaller than a threshold, if so, proceeding to step 3), and otherwise, proceeding to step 2);

step 2) adjusting the pressures in the plurality of gravity compensators based on the difference, and looping back to step 1);

step 3) performing a vertical zeroing process using the plurality of relative-position sensors; and step 4) adjusting zero-position deviations based on results of the vertical zeroing process.

In the method, adjusting the pressures in the plurality of gravity compensators in step 2) may include calculating amounts of the pressures in the plurality of gravity compensators to be changed by multiplying differences between actual and preset positions of the plurality of gravity compensators by proportional coefficients.

In the method, each of the grating scales may be provided with a zero-position mark, wherein step 3) includes outputting a high electrical level upon the zero-position mark being scanned and, otherwise, outputting a low electrical level.

In the method, step 4) may include adjusting the zero-position deviations of the grating scales based on the zero-position deviation results of the vertical zeroing process.

In the method, adjusting the pressures in the plurality of gravity compensators in step 2) may be accomplished by a feedback control loop, the feedback control loop including:

a trajectory generator for generating a trajectory taking into account an acceleration, a velocity and a position of the fine-motion plate;

a feedforward controller configured to produce a feedforward force based on a signal from the trajectory generator indicative of the acceleration, velocity and position;

a feedback controller configured to take the differences between preset absolute-position values and actual absolute-position measurements, of the fine-motion plate, as inputs to produce a feedback control force; and an actuator decoupling module, configured to decouple a combination of the feedforward force produced by the feedforward controller and the feedback control force produced by the feedback controller into the pressures for the plurality of gravity compensators.

In another embodiment of the present invention, a method for initialization of a vertical position of a wafer stage of a photolithography tool is proposed, including the steps of:

1) performing closed-loop control over the plurality of vertical motors using a first feedback control loop comprising the plurality of absolute-position sensors;

2) moving the fine-motion plate by the plurality of vertical motors such that the absolute position of the fine-motion plate is within an initial vertical position threshold;

3) clearing the plurality of relative-position sensors; and 4) performing closed-loop control over the plurality of vertical motors using a second feedback control loop including the plurality of relative-position sensors.

In this method, the first feedback control loop may include:

a first trajectory generator for generating a trajectory taking into account an acceleration, a velocity and a position of the fine-motion plate;

a first feedforward controller configured to produce a feedforward force based on a signal from the first trajectory generator indicative of the acceleration, velocity and position;

a first measurement decoupling module, configured to decouple absolute-position measurements obtained by the plurality of absolute-position sensors into absolute-position values of the fine-motion plate and output the absolute-position values;

a first feedback controller configured to take differences between preset absolute-position values of the fine-motion plate and the absolute-position values thereof output from the first measurement decoupling module as inputs to produce a feedback control force; and a motor actuator decoupling module, configured to decouple a combination of the feedforward force produced by the feedforward controller and the feedback control force produced by the feedback controller into pressures for the plurality of vertical motors.

In this method, the second feedback control loop may include:

a second trajectory generator for generating a trajectory taking into account an acceleration, a velocity and a position of the fine-motion plate;

a second feedforward controller configured to produce a feedforward force based on a signal from the second trajectory generator indicative of the acceleration, velocity and position;

a second measurement decoupling module, configured to decouple the absolute-position measurements obtained by the plurality of relative-position sensors into relative-position values of the fine-motion plate and output the relative-position values;

a second feedback controller configured to take differences between the preset absolute-position of the fine-motion plate values and the absolute-position values thereof output from the second measurement decoupling module as inputs to produce a feedback control force; and a motor actuator decoupling module, configured to decouple a combination of the feedforward force produced by the feedforward controller and the feedback control force produced by the feedback controller into pressures for the plurality of vertical motors.

According to the present invention, the wafer stage has improved stability in its vertical zero position relative to the whole system, thereby solving the low reliability problem arising from a low vertical motion precision due to vertical zeroing inaccuracies. In addition, the wafer stage and methods according to the present invention facilitates vertical mounting and adjustments of a grating scale.

BRIEF DESCRIPTION OF THE DRAWINGS

The advantages and spirit of the present invention will be better understood with reference to the following detailed description which is to be read in conjunction with the accompanying drawings, in which.

DETAILED DESCRIPTION

Several specific embodiments of the present invention will be described in detail below with reference to the accompanying drawings.

Figure 1:
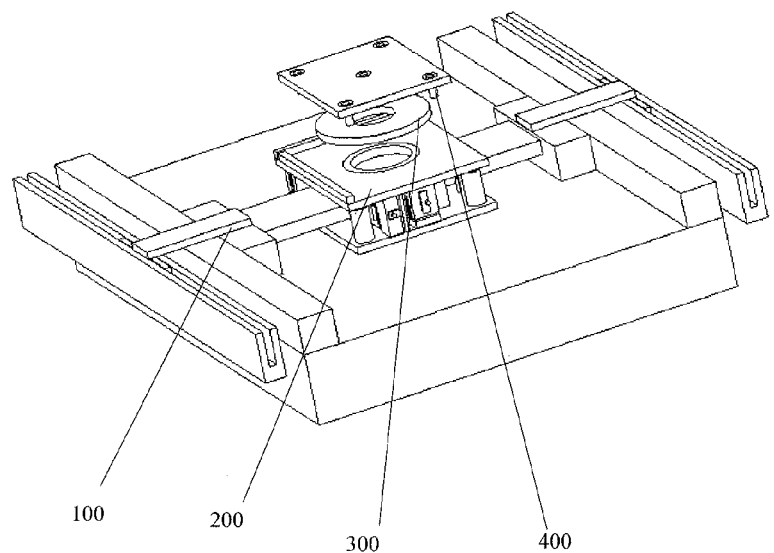
FIG. 1 is a schematic illustration of a wafer stage in a photolithography tool according to the present invention.

FIG. 1 is a diagram schematically illustrating a wafer stage in a photolithography tool according to the present invention. As shown in FIG. 1, the wafer stage in a photolithography tool according to the present invention includes a long-stroke module 100, a fine-motion module 200, a rotary pre-alignment module 300 and a substrate transfer module 400. The long-stroke module 100 is configured for wide-range horizontal positioning and includes at least one X-guideway, at least one X-slider, at least one X-drive motor, at least one Y-guideway, at least one Y-slider, at least one Y-drive motor, and a component for transmission of counterforces to outer side. The rotary pre-alignment module 400 includes a pre-alignment motor, grating scales, guide rollers and a turntable. The substrate transfer module 400 includes support assemblies and vacuum assemblies. Each of the modules 100, 300 and 400 and their constituent components may have one of a variety of designs or configurations known to those skilled in the art, which is not described herein for conciseness.

Figure 2:
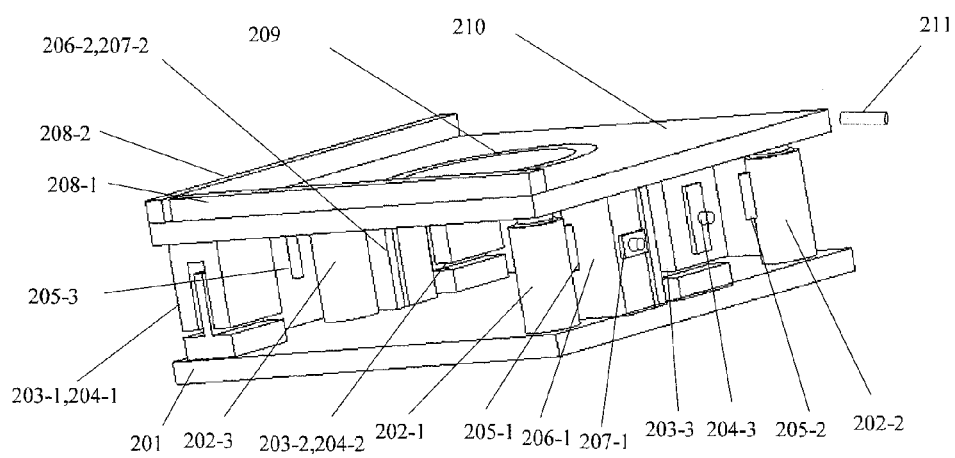
FIG. 2 is a schematic illustration of a fine-motion module in a wafer stage in a photolithography tool according to the present invention.

A main aspect of the present invention lies in the fine-motion module 200, which, as shown in FIG. 2, includes a base 201, gravity compensators 202, vertical motors 203, vertical grating scales 204, eddy current sensors 205, Rz-motors 206, Rz-grating scales 207, elongated mirrors 208, a circular gas levitator 209, a fine-motion plate 210 and an Rz-eddy current sensor 211. In the present invention, the eddy current sensors 205, 211 are configured to obtain absolute position measurements between the base 201 and the fine-motion plate 210, and the use of the eddy current sensors does not require zero-position reestablishment. In addition to the eddy current sensors, typical examples of applicable devices for this purpose also include linear variable differential transformer (LVDT) sensors, linear differential sensors, etc. The eddy current sensors only serve as an example for facilitating the description of the invention rather than as any limitation thereto. The grating scales 204 and 207 are used as sensors to obtain relative position measurements between the base 201 and the fine-motion plate 210, and the use of the grating scales requires zero-position recalibration. In addition to the grating scales, typical examples of applicable devices for this purpose also include laser interferometers, laser scales, etc. The grating scales only serve as an example for facilitating the description of the invention rather than as any limitation thereto.

In the illustrated embodiment, the gravity compensators 202 include three compensators 202-1, 202-2 and 202-3, which are uniformly distributed on a circle centered at a center of the fine-motion plate 210 in order to support the gravity of the fine-motion plate 210. Each of the gravity compensators has a very low rigidity both in the horizontal and vertical directions. While the gravity compensators 202 have been described and illustrated in the embodiment as including three compensators, the present invention is not limited in this regard, as the gravity compensators 202 may also include four compensators. The circular gas levitator 209 is configured to guide the movement of the fine-motion plate 210 in the vertical (Z) and Rz directions. The circular gas levitator may either be a unitary one-piece structure or a multiple structure. With use of the circular gas levitator 209 combined with the gravity compensators 202, the fine-motion plate 210 has a natural frequency not higher than 15 Hz both in the Z and Rz directions. The vertical grating scales 204 include three grating scales 204-1, 204-2 and 204-3 respectively for measuring Z-position, Rx-position and Ry-position. The vertical motors 203 include three motors 203-1, 203-2 and 203-3 respectively configured to provide Z-directional driving force, Rx-directional driving force and Ry-directional driving force. The Rz-grating scales 207 include two grating scales 207-1 and 207-2 both configured to measure an Rz-position. While the Rz-grating scales 207 have been described and illustrated in the embodiment as including two grating scales, the present invention is not limited in this regard, as only one grating scale may also be used. The Rz-eddy current sensor 211 is configured to measure an absolute Rz-position of the fine-motion plate 210. While it has been described and illustrated that only one Rz-eddy current sensor 211 is used, the present invention is not so limited and two symmetrically arranged sensors may also be used. The Rz-motors 206 include two motors 206-1 and 206-2, which are symmetrically arranged to provide a couple of forces for driving the fine-motion plate 210 to rotate in the Rz-direction. The eddy current sensors 205 include three sensors 205-1, 205-2 and 205-3 respectively configured to measure absolute positions in the Z, Rx and Ry directions. The elongated mirrors 208 include two mirrors 208-1 and 208-2 for the measurement of an interferometric optical path.

Due to size limitations, the vertical grating scales 204 are usually selected as high-precision relative grating scales. A typical relative grating scale can provide a measurement resolution of up to 5-50 nm. However, such a relative grating scale relies on a zeroing process for the establishment of a vertical zero position, and in case of an initial absolute position distant from the zero position, the vertical zeroing of the relative grating scale may lead to inaccurate results or even failure.

The gravity compensators 202 are typically controlled using proportional pressure valves. Prior to the vertical zeroing process of the relative grating scales, an initial vertical absolute position of the fine-motion plate 210 is limited by a control accuracy of the proportional pressure valves, as well as by the magnitude of disturbance the fine-motion plate is subject to. Generally, the control accuracy of the proportional pressure valves is much susceptible to fluctuations in the used gas supply. When the fine-motion plate 210 is supported by the gravity compensators in an initial vertical position, robustness of which is not ensured, the reliability of the vertical initialization and zeroing processes will be dramatically influenced.

To this end, the eddy current sensors 205 are further included to measure the vertical absolute position of the fine-motion plate 210 with a precision of 0.1-10 µm. Using the absolute position measurements of the fine-motion plate obtained by the eddy current sensors 205 as feedbacks, pressures of gas supplied to the gravity compensators 202 can be adjusted such that the initial position of the fine-motion plate is tuned to a given position that is favorable to vertical zeroing of the relative grating scales.

Embodiment 1

Figure 3:
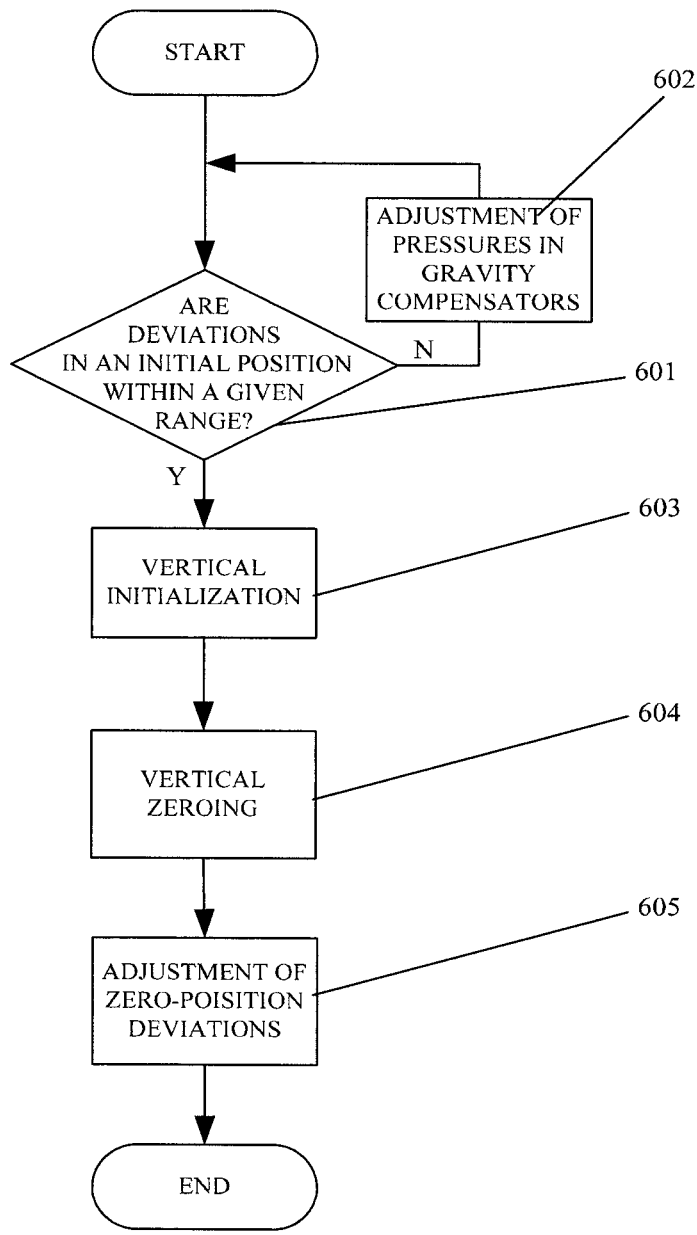
FIG. 3 is a flow chart graphically illustrating a method for initialization of a vertical position of a wafer stage in a photolithography tool according to a first embodiment of the present invention.

FIG. 3 is a flow chart graphically illustrating a method for initialization of a vertical absolute position of a wafer stage. In Step 601, it is determined whether an initial vertical position (absolute position) of the fine-motion plate 210 is within a given range. This may be accomplished by comparing measurements of the three eddy current sensors, $Z_{11}$, $Z_{21}$ and $Z_{31}$, with preset absolute zero-position values $Z_{10}$, $Z_{20}$ and $Z_{30}$, and determining whether the three deviations are within a given range $Z_{v0}$, i.e., determining whether the following conditions are satisfied:

$$\begin{cases} |Z_{11} - Z_{10}| \leq Z_{v0} \\ |Z_{21} - Z_{30}| \leq Z_{v0} \\ |Z_{31} - Z_{30}| \leq Z_{v0} \end{cases} \qquad \text{Formula (1)}$$

If the conditions are not met, Step 602 is performed to adjust pressures in the gravity compensators, thereby changing the initial vertical position of the fine-motion plate 210. This may be accomplished by converting the foregoing deviations into positional deviations of the gravity compensators and then linearly converting the positional deviations into pressure margins. The pressure adjustment for the gravity compensators is given by:

$$\begin{bmatrix} F_{ge1} \\ F_{ge2} \\ F_{ge3} \end{bmatrix} = - \begin{bmatrix} k_1 \\ k_2 \\ k_3 \end{bmatrix} \begin{bmatrix} a_{11} & a_{12} & a_{13} \\ a_{21} & a_{22} & a_{23} \\ a_{31} & a_{32} & a_{33} \end{bmatrix} \begin{bmatrix} Z_{11} - Z_{10} \\ Z_{21} - Z_{20} \\ Z_{31} - Z_{30} \end{bmatrix} \qquad \text{Formula (2)}$$

$$A = \begin{bmatrix} a_{11} & a_{12} & a_{13} \\ a_{21} & a_{22} & a_{23} \\ a_{31} & a_{32} & a_{33} \end{bmatrix}$$

where, $Z_{11}$-$Z_{10}$, $Z_{21}$-$Z_{20}$ and $Z_{31}$-$Z_{30}$ represent the deviations measured by the three eddy current sensors; A is a constant coefficient matrix indicative of a conversion relationship from levels of the three eddy current sensors to levels of the three gravity compensators; and k1, k2 and k are linear coefficients.

Steps 602 and 601 may be repeated until the three initial vertical deviations satisfy Formula (1). Upon this occurring, the process can proceed to Step 603.

Steps 603-605 are configured to establish vertical zero positions (relative positions) for the grating scales. Specifically, in Step 603, the vertical grating scales enable closed-loop control over the vertical motors. In Step 604, a vertical zeroing process is carried out to search for the positions of zero-position sensors of the grating scales 204. Each of the grating scales is provided with a zero-position mark fixed at the middle of the body of the corresponding grating scale. Upon the mark being scanned, a high electrical level (TRUE) is output, and otherwise a low electrical level (FALSE) is output. In this way, the zero positions can be identified. In Step 605, zero-position deviations of the grating scales 204 are adjusted based on deviation measurements obtained in the zeroing process.

With these steps, a higher initialization and zeroing accuracy can be achieved for the fine-motion plate 210.

In Embodiment 1, the process of adjusting the pressures in the gravity compensators 202 so that the measurements of the eddy current sensors 205 are within the respective given ranges is an open-loop control process, which, however, takes a relative long time to complete the initial vertical position adjustment and is thus unfavorable to the throughput to some extent.

Embodiment 2

In this embodiment, described are a method for vertical control of a wafer stage in a photolithography tool and a method for vertical zeroing thereof. According to the vertical control method, the position of the fine-motion plate 210 is quickly adjusted to a given range by controlling the pressures in the gravity compensators 202 based on fed back measurements of the eddy current sensors 205.

Figure 4:
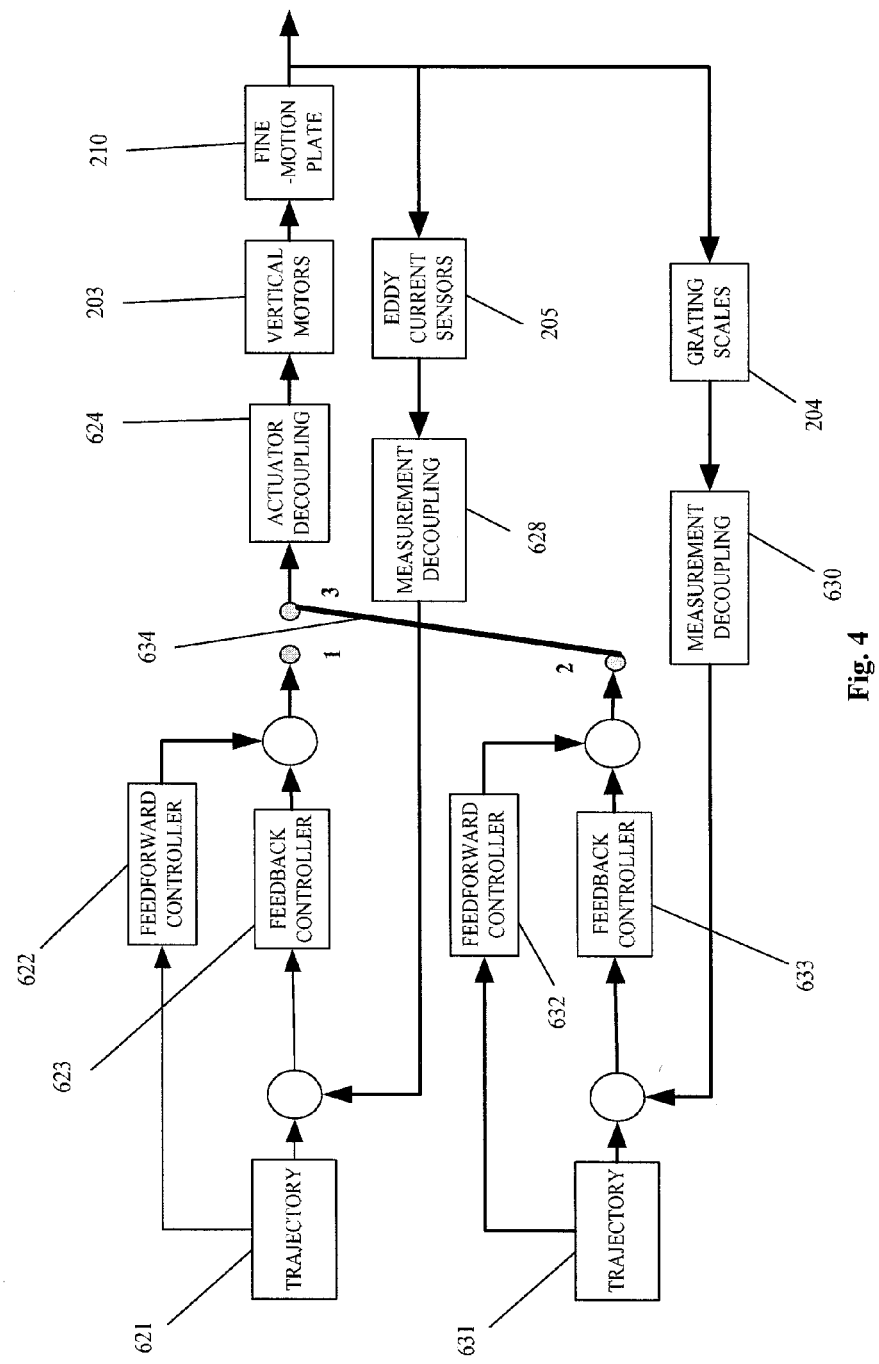
FIG. 4 is a diagram showing a control process in initialization of a vertical position of a wafer stage in a photolithography tool according to a second embodiment of the present invention.

As shown in FIG. 4, the vertical control method according to this Embodiment is switchable between an initialization process and a process for adjusting zero-position deviations of the grating scales. Upon interconnection of the connectors 1, 3, a trajectory generator 621 generates a trajectory taking into account an acceleration, a velocity and a position of the fine-motion plate 210; a feedforward controller 622 generates a feedforward force based on a signal indicative of the acceleration, velocity and position, thereby achieving quick response of the feedforward process; a feedback controller 623, which is implemented as a conventional proportional-integral-derivative (PID) controller, takes the difference between the predetermined and actual positions as an input to prescribe a feedback control force; a motor actuator decoupling module 624 translates components of the prescribed feedback control force along the three logic axes, Z, Rx and Ry, into physical outputs of the three vertical motors 203; the three eddy current sensors 205 obtain absolute position measurements of the fine-motion plate 210; and a measurement decoupling module 628 calculates absolute positions in the Z, Rx and Ry axes based on the measurements obtained by the eddy current sensors 205 and feeds the calculated positions back to the feedback controller 623. This is repeated until the initialization of the vertical position of the fine-motion plate, i.e., advancement of the fine-motion plate to a given position, is achieved. This process is a control process for the above first set of controllers. Subsequently, a switch 634 is operated to effect interconnection of the connectors 2, 3. This is followed by: the vertical grating scales 204 obtaining relative position measurements of the fine-motion plate 210; the measurement decoupling module 630 calculating relative positions in the Z, Rx and Ry axes based on the measurements obtained by the vertical grating scales 204; a trajectory generator 631 performing the same operation as the trajectory generator 621, i.e., generating a trajectory taking into account an acceleration, a velocity and a position of the fine-motion plate 210; feedforward and feedback controllers 632, 633 performing the same operations as the feedforward and feedback controllers 622, 623, respectively. This is repeated until signals are cleared from the grating scales, i.e., the completion of zero-position deviation adjustment for the grating scales. This process is a control process for the above second set of controllers. The switch 634 is configured to switch between the two sets of controllers.

Control of the motors based on the eddy current sensors is implementable in a frequency band from 1 Hz to 20 Hz, and that based on the grating scales is implementable in a frequency band from 30 Hz to 100 Hz.

Figure 5:
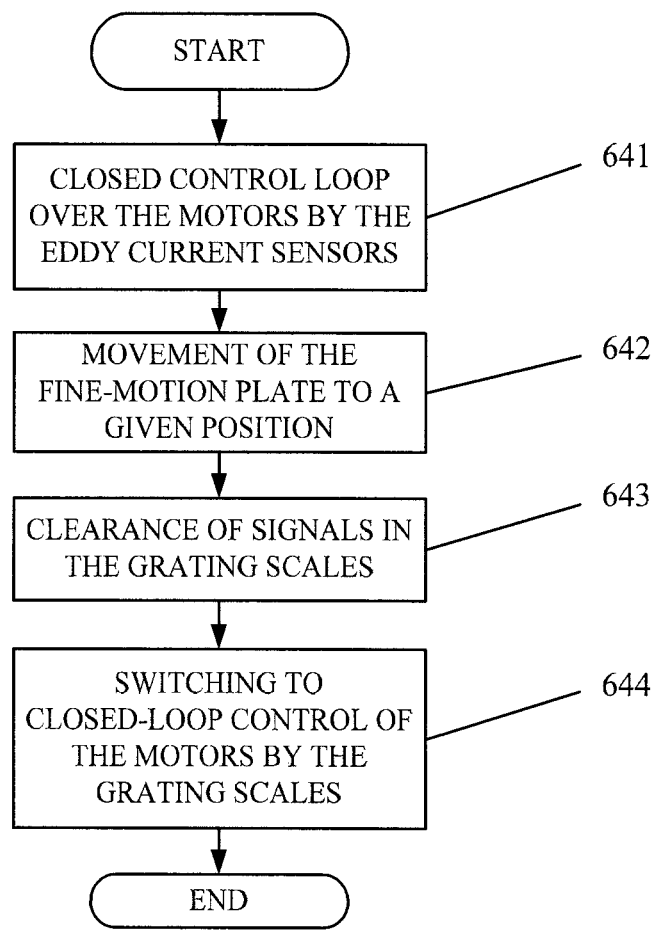
FIG. 5 is a flow chart showing a method for vertical position zeroing of the wafer stage in the photolithography tool according to the second embodiment of the present invention.

On the basis of the vertical control method according to Embodiment 2, a zeroing method is also proposed which, as shown in FIG. 5, includes: Step 641, in which the eddy current sensors 205 perform closed-loop control over the gravity compensators; Step 642, in which the eddy current sensors 205 act as a closed control loop of a measurement system to allow the gravity compensators to move the fine-motion plate 210 to a given position; Step 643, in which signals in the grating scales are cleared; and Step 644, in which the control of the gravity compensators by the eddy current sensors 205 is switched to closed-loop control of the vertical motors 203 by the grating scales.

With this method, vertical initialization of the wafer stage can be achieved rapidly.

Embodiment 3

Figure 6:
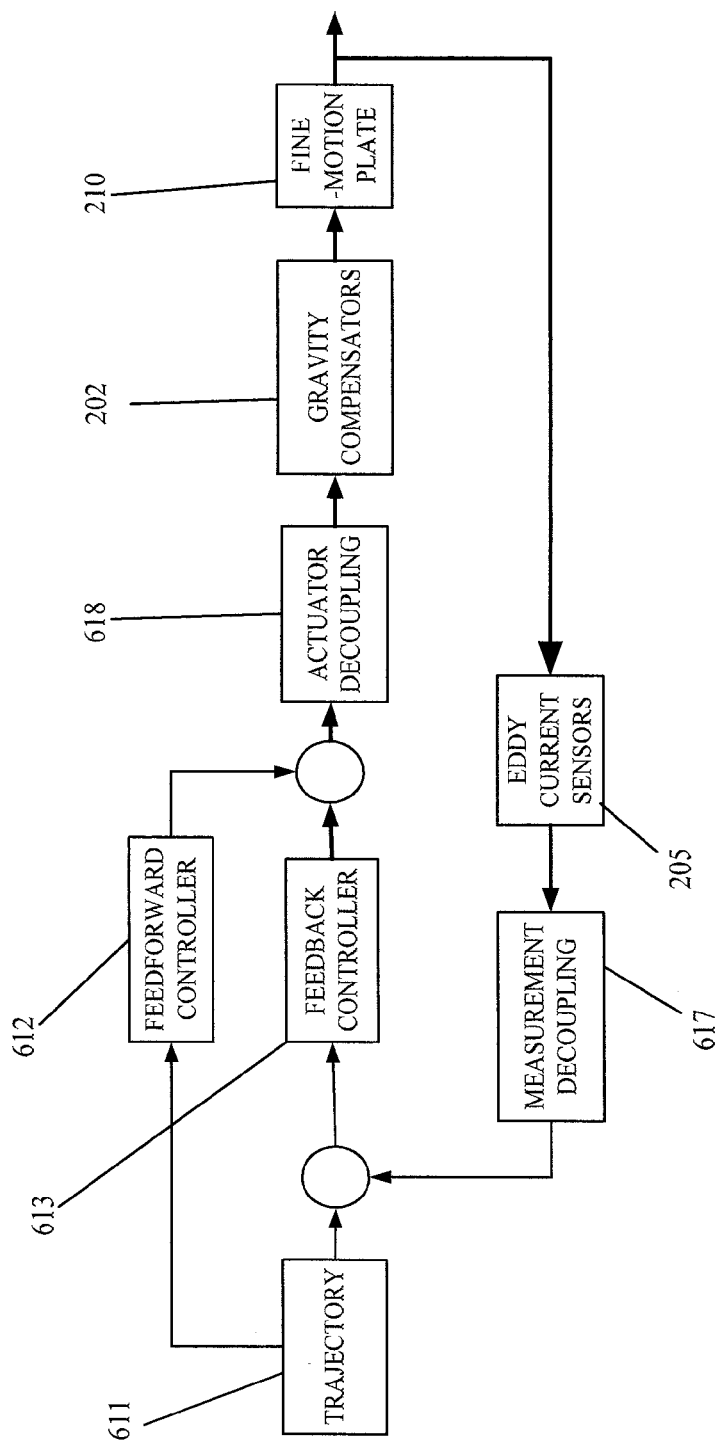
FIG. 6 is a diagram showing a control process in vertical position zeroing of a wafer stage in a photolithography tool according to a third embodiment of the present invention.

FIG. 6 shows a vertical position control method according to Embodiment 3 of the present invention, which enables closed-loop pneumatic control of the gravity compensator 202 in the vertical Z, Rx and Ry directions based on feedbacks from the eddy current sensors 205 and provides the advantages of no heat output and less impact.

The vertical position control method according to Embodiment 3 differs from that according to Embodiment 2 in, upon the interconnection of the connectors 1, 3 (i.e., the first set of controllers), involving the gravity compensators instead of the vertical motors. Accordingly, in the vertical position control method according to Embodiment 3, a trajectory generator 611 generates a trajectory taking into account an acceleration, a velocity and a position of the fine-motion plate 210; a feedforward controller 612 generates a feedforward force based on a signal indicative of the acceleration, velocity and position from the trajectory generator 611, thereby achieving quick response of the feedforward process; a feedback controller 613, which is implemented as a conventional PID controller, takes the difference between the predetermined and actually measured positions as an input to prescribe a feedback control force for maintaining the system's closed loop in stability; a motor actuator decoupling module 618 translates components of a combination of the forces from the feedforward controller 612 and the feedback controller 613 along the three logic axes, Z, Rx and Ry, into physical outputs of the three gravity compensator 202; the outputs of the gravity compensator 202 act on the fine-motion plate 210 and thereby cause changes in the Z-position, Rx-position and Ry-position; a measurement decoupling module 617 decouples absolute-position measurements of the fine-motion plate 210 obtained by the three eddy current sensors 205 into positions of the fine-motion plate on the Z, Rx and Ry logic axes. Differences between positions set by the trajectory generator 611 in advance and corresponding positions on the logic axes actually measured by the eddy current sensors act as inputs of the feedback controller 613 for deviation control.

Control of the motors based on the eddy current sensors is implementable in a frequency band from 1 Hz to 20 Hz and is only for moving the fine-motion plate into a given position. Control of the motors based on the grating scales is implementable in a frequency band from 30 Hz to 100 Hz.

Figure 7:
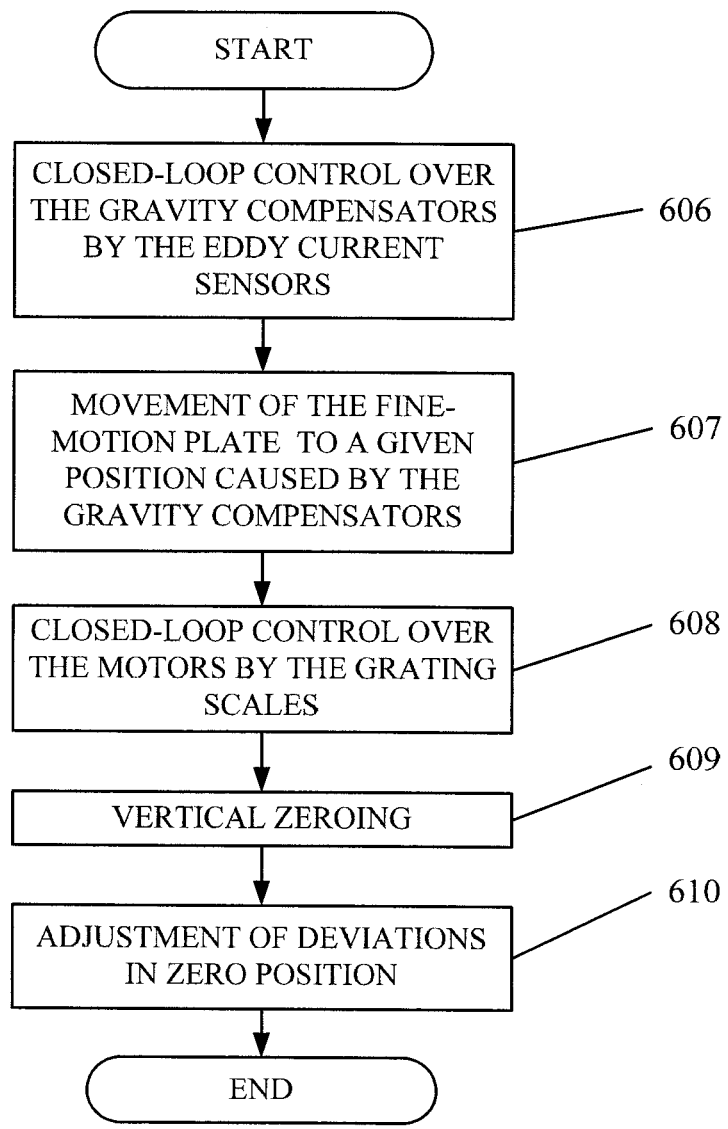
FIG. 7 is a flow chart showing a method for vertical position zeroing of the wafer stage in the photolithography tool according to the third embodiment of the present invention.

FIG. 7 is a flow chart graphically illustrating a corresponding vertical zeroing method, including: Step 606, in which the eddy current sensors perform closed-loop control over the gravity compensators in the same manner as shown in FIG. 4; and Step 607, in which a vertical absolute position of the fine-motion plate is adjusted to a given position, wherein the adjustment of the vertical absolute position of the fine-motion plate is effectuated by adjusting pressures in the gravity compensators, which causes a minor impact on the fine-motion plate without generation of heat; and Steps 608-610 are the same as Steps 603-605 described in Embodiment 1.

Apart from those of Embodiment 1, this embodiment further has the following advantages: the position adjustment realized by adjusting the pressures is rapid, causes a minor impact on the fine-motion plate, and does not cause heat generation; and the zeroing method using the eddy current sensors can achieve a stable zero position.

Disclosed herein are merely several preferred embodiments of the present invention, which are presented for the only purpose of describing the subject matter of the invention rather than limiting the invention in any way. All and any alternative embodiments obtainable by those skilled in the art through logical analysis, inference or limited experimentation based on the principles of the present invention are considered to be within the scope thereof.

What is claimed is:

1. A fine-motion module for use in a wafer stage of a photolithography tool, comprising:
    a base;
    a fine-motion plate;
    a plurality of vertical motors, fixed between the base and the fine-motion plate;
    a plurality of gravity compensators, each having one end fixed on the base and the other end configured to support the fine-motion plate;
    a plurality of absolute-position sensors, configured to measure an absolute position of the fine-motion plate and to adjust pressures in the plurality of gravity compensators based on the obtained absolute-position measurements such that the absolute position of the fine-motion plate is changed to a predetermined initial vertical position; and
    a plurality of relative-position sensors, configured to measure a relative position of the fine-motion plate to the base and to control the fine-motion plate based on the obtained relative-position measurements so that the fine-motion plate is moved to a relative zero position.

2. The fine-motion module according to claim 1, wherein the plurality of absolute-position sensors are eddy current sensors, linear variable differential transformer sensors, or linear differential sensors.

3. The fine-motion module according to claim 1, wherein the plurality of relative-position sensors are laser interferometers, laser scales or grating scales.

4. The fine-motion module according to claim 1, wherein the pressures in the plurality of gravity compensators are controlled using proportional pressure valves.

5. The fine-motion module according to claim 1, wherein the fine-motion module further comprises a plurality of elongated mirrors and a circular gas levitator.

6. A method for initialization of a vertical position of a fine-motion module as defined in claim 1, comprising the steps of:
    step 1) determining whether a difference of the absolute position of the fine-motion plate from the predetermined initial vertical position is smaller than a threshold, if so, proceeding to step 3), and otherwise, proceeding to step 2);
    step 2) adjusting the pressures in the plurality of gravity compensators based on the difference, and looping back to step 1);
    step 3) performing a vertical zeroing process using the plurality of relative-position sensors; and
    step 4) adjusting zero-position deviations based on results of the vertical zeroing process.

7. The method according to claim 6, wherein adjusting the pressures in the plurality of gravity compensators in step 2) comprises calculating amounts of the pressures in the plurality of gravity compensators to be changed by multiplying differences between actual and preset positions of the plurality of gravity compensators by proportional coefficients.

8. The method according to claim 6, wherein each of the grating scales is provided with a zero-position mark, and that step 3) comprises outputting a high electrical level upon the zero-position mark being scanned and, otherwise, outputting a low electrical level.

9. The method according to claim 6, wherein step 4) comprises adjusting the zero-position deviations of the grating scales based on the zero-position deviation results of the vertical zeroing process.

10. The method according to claim 6, wherein adjusting the pressures in the plurality of gravity compensators in step 2) is accomplished by a feedback control loop, the feedback control loop comprising:
    a trajectory generator for generating a trajectory taking into account an acceleration, a velocity and a position of the fine-motion plate;
    a feedforward controller configured to produce a feedforward force based on a signal from the trajectory generator indicative of the acceleration, velocity and position;
    a feedback controller configured to take differences between preset absolute-position values and actual absolute-position measurements, of the fine-motion plate, as inputs to produce a feedback control force; and
    an actuator decoupling module, configured to decouple a combination of the feedforward force produced by the feedforward controller and the feedback control force produced by the feedback controller into the pressures for the plurality of gravity compensators.

11. A method for initialization of a vertical position of a fine-motion module as defined in claim 1, comprising the steps of:
   a) performing closed-loop control over the plurality of vertical motors using a first feedback control loop comprising the plurality of absolute-position sensors;
   b) moving the fine-motion plate by the plurality of vertical motors such that the absolute position of the fine-motion plate is within an initial vertical position threshold;
   c) clearing the plurality of relative-position sensors; and
   d) performing closed-loop control over the plurality of vertical motors using a second feedback control loop comprising the plurality of relative-position sensors.

12. The method according to claim 11, wherein the first feedback control loop comprises:
   a first trajectory generator for generating a trajectory taking into account an acceleration, a velocity and a position of the fine-motion plate;
   a first feedforward controller configured to produce a feedforward force based on a signal from the first trajectory generator indicative of the acceleration, velocity and position;
   a first measurement decoupling module, configured to decouple the absolute-position measurements obtained by the plurality of absolute-position sensors into absolute-position values of the fine-motion plate and output the absolute-position values;
   a first feedback controller configured to take differences between preset absolute-position values of the fine-motion plate and the absolute-position values thereof output from the first measurement decoupling module as inputs to produce a feedback control force; and
   a motor actuator decoupling module, configured to decouple a combination of the feedforward force produced by the feedforward controller and the feedback control force produced by the feedback controller into pressures for the plurality of vertical motors.

13. The method according to claim 11, wherein the second feedback control loop comprises:
   a second trajectory generator for generating a trajectory taking into account an acceleration, a velocity and a position of the fine-motion plate;
   a second feedforward controller configured to produce a feedforward force based on a signal from the second trajectory generator indicative of the acceleration, velocity and position;
   a second measurement decoupling module, configured to decouple the absolute-position measurements obtained by the plurality of relative-position sensors into relative-position values of the fine-motion plate and output the relative-position values;
   a second feedback controller configured to take differences between the preset absolute-position of the fine-motion plate values and the absolute-position values thereof output from the second measurement decoupling module as inputs to produce a feedback control force; and
   a motor actuator decoupling module, configured to decouple a combination of the feedforward force produced by the feedforward controller and the feedback control force produced by the feedback controller into pressures for the plurality of vertical motors.

* * * * *